United States Patent
Reina et al.

(10) Patent No.: US 11,762,771 B2
(45) Date of Patent: Sep. 19, 2023

(54) ADVANCED POWER OFF NOTIFICATION FOR MANAGED MEMORY

(71) Applicant: Micron Technology, Inc., Boise, ID (US)

(72) Inventors: Vincenzo Reina, Munich (DE); Binbin Huo, Sauerlach (DE)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 17/241,850

(22) Filed: Apr. 27, 2021

(65) Prior Publication Data
US 2022/0342819 A1    Oct. 27, 2022

(51) Int. Cl.
*G06F 12/0804*    (2016.01)
*G01K 3/06*    (2006.01)

(52) U.S. Cl.
CPC ......... *G06F 12/0804* (2013.01); *G01K 3/06* (2013.01); *G06F 2212/1032* (2013.01)

(58) Field of Classification Search
CPC ......... G06F 12/0804; G06F 2212/1032; G06F 13/1626; G06F 13/3625; G06F 11/3062; G01K 3/06
See application file for complete search history.

(56) References Cited

U.S. PATENT DOCUMENTS

| 10,013,194 | B1* | 7/2018 | Yang ..................... G06F 3/0652 |
| 2006/0015683 | A1* | 1/2006 | Ashmore .............. G06F 1/3268 711/135 |
| 2011/0185211 | A1* | 7/2011 | Chiasson .............. G06F 1/3287 714/48 |
| 2018/0322051 | A1* | 11/2018 | Heller ................. G06F 12/0868 |
| 2022/0206821 | A1* | 6/2022 | Devegowda ........ G06F 12/0238 |

* cited by examiner

*Primary Examiner* — Prasith Thammavong
(74) *Attorney, Agent, or Firm* — Holland & Hart LLP

(57) ABSTRACT

Methods, systems, and devices for advanced power off notification for managed memory are described. An apparatus may include a memory array comprising a plurality of memory cells and a controller coupled with the memory array. The controller may be configured to receive a notification indicating a transition from a first state of the memory array to a second state of the memory array. The notification may include a value, the value comprising a plurality of bits and corresponding to a minimum duration remaining until a power supply of the memory array is deactivated. The controller may also execute a plurality of operations according to an order determined based at least in part on a parameter associated with the memory array and receiving the notification comprising the value.

15 Claims, 10 Drawing Sheets

ADVANCED POWER OFF NOTIFICATION FOR MANAGED MEMORY

FIELD OF TECHNOLOGY

The following relates generally to one or more systems for memory and more specifically to advanced power off notification for managed memory.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
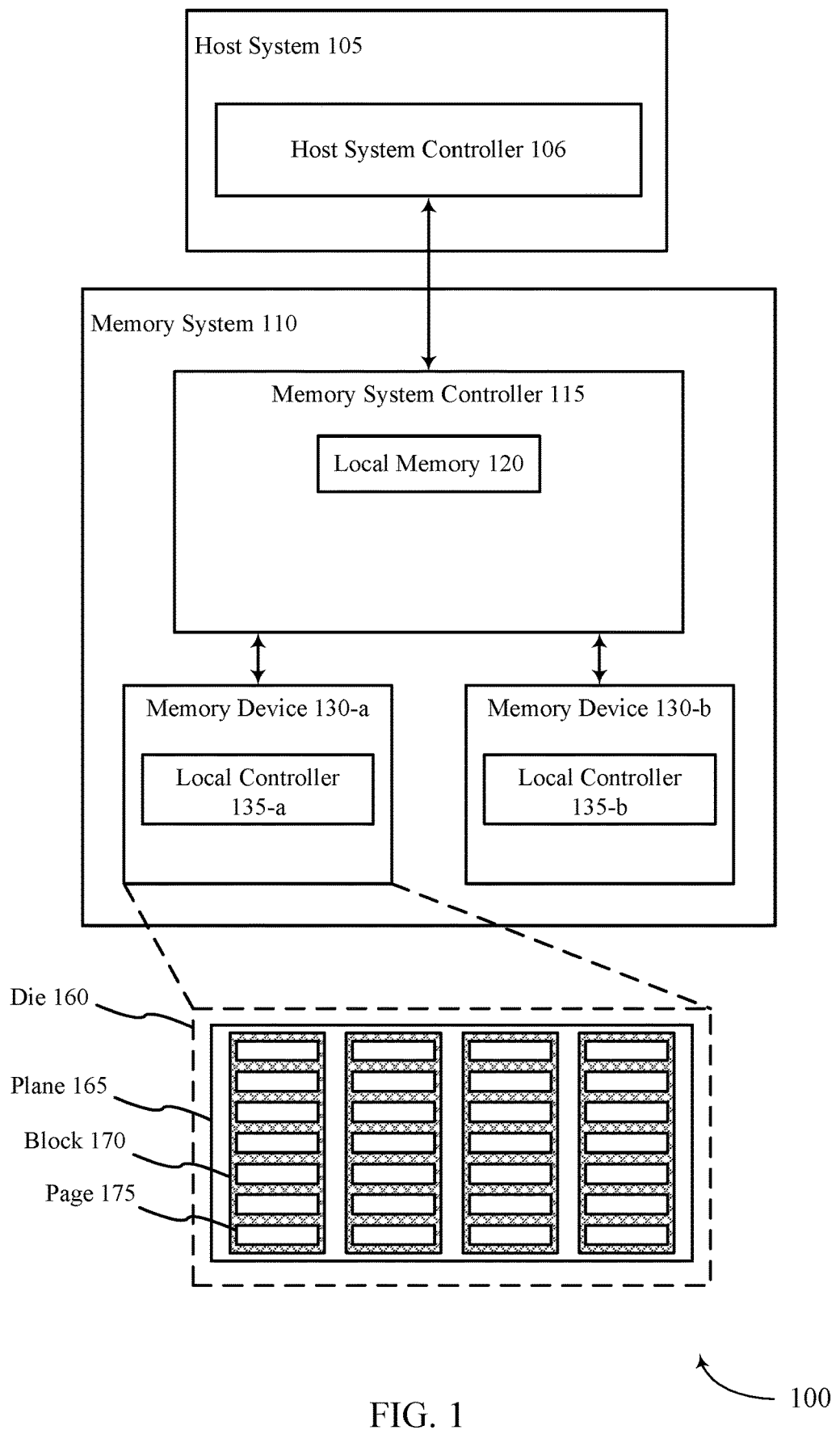
FIG. 1 illustrates an example of a system that supports advanced power off notification for managed memory in accordance with examples as disclosed herein.

A system may include a host system and a memory system that stores data for the host system. For example, the memory system may include NAND memory cells that store logic states associated with data from the host system. In some cases, the memory system may perform background operations or data maintenance operations like garbage collection, refresh of data, or transferring data from one location to another. For example, in managed NAND systems, the memory system may perform folding of data from single level cell (SLC) to triple level cell (TLC) blocks. When these operations are not executed in the background the performance of the memory system may be degraded and impact user experience—e.g., when these operations are performed concurrently with other access operations initiated by the host system, the performance of the memory system may be degraded. Additionally, the host system may provide power to the memory system for some time after it issues a power off notification—e.g., the memory system may remain supplied with a voltage for some time after receiving power notification rather than being immediately shut off. A memory system may attempt to utilize this additional period of power (e.g., time budget) to perform the background operations. In current implementations, the memory system may be unaware of the time budget (e.g., the duration of time before the power supplied to the memory system is deactivated). Accordingly, the memory system may be unable to fully take advantage of the time and perform the background operations.

Systems, techniques, and devices are described herein for a host system to indicate how much time is available until a power supply of the memory system is deactivated (e.g., a time budget) after the host system transmits a power off notification. This may enable the memory system to take advantage of the time budget for background operations with reduced risk of the operation being interrupted—e.g., with the power supply being deactivated while the memory system is performing the operation. The host system may provide the time budget using a value that indicates an amount of time by indexing one of multiple (three or more) time values, or by indicating a number that corresponds to the amount of time (e.g., when multiplied by a factor). In some examples, the memory system may also further respond to the power off notification by providing a requested duration of time prior to the deactivation of the power supply based on determining a duration of time to perform the background operations. If the requested duration of time is less than the time budget transmitted by the host system, the host system may deactivate the power supply based on the initial value. If the requested duration of time is greater than the time budge transmitted by the host system, the host system may accept the requested duration of time and respond with an updated time budget or the host system may keep the initial time budget and not provide an updated time—e.g., the host system may not send a new power notification with the requested time duration.

Features of the disclosure are initially described in the context of systems, devices, and circuits as described with reference to FIGS. 1 and 2. Features of the disclosure are described in the context process flow diagrams as described with reference to FIGS. 3 and 4. These and other features of the disclosure are further illustrated by and described with reference to an apparatus diagram and flowcharts that relate to advanced power off notification for managed memory as described with reference to FIGS. 5-10.

FIG. 1 illustrates an example of a system 100 that supports advanced power off notification for managed memory in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA)controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support advanced power off notification for managed memory. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, the host system 105 may transmit a power off notification to the memory system 110. That is, the host system 105 may not immediately power off the memory system 110 and may instead transmit a notification indicating that a power off is imminent. In some examples, the memory system 110 may not be able to determine the amount of time remaining until the power supply of the memory system 110 is deactivated. That is, although the memory system 110 may be given an indication that a power off will occur, the memory system 110 may not know when or how long until the power is deactivated. Accordingly, the memory system 110 may be limited in the types of or quantity of operations the memory system 110 may perform between the power off notification and the deactivation. For example, the memory system 110 may need time to perform background operations such as refreshing or garbage collection. Performing these operations concurrently with operations associated with the host system 105 may cause the performance of the system to be degraded. The time between the power off notification and the deactivation may allow the memory system 110 to perform these background operations. Without knowing the amount of time remaining, the memory system 110 may be unable to fully take advantage of this time.

As described herein, the host system 105 may transmit a power off notification that includes a value indicating an amount of time remaining until the memory system 110 is deactivated (e.g., the power is removed or deactivated). As such, the memory system 110 may be better able to take advantage of the time remaining—e.g., the memory system 110 may reduce the risk of an operation being suspended by the deactivation of the memory system 110. The memory system 110 may also determine an amount of time needed to perform the operations and transmit a request for additional time. In such examples, the host system 105 may accept the request and increase the time or maintain the original time and deactivate the memory system 110 after the time indicated in the power off notification.

Figure 2:
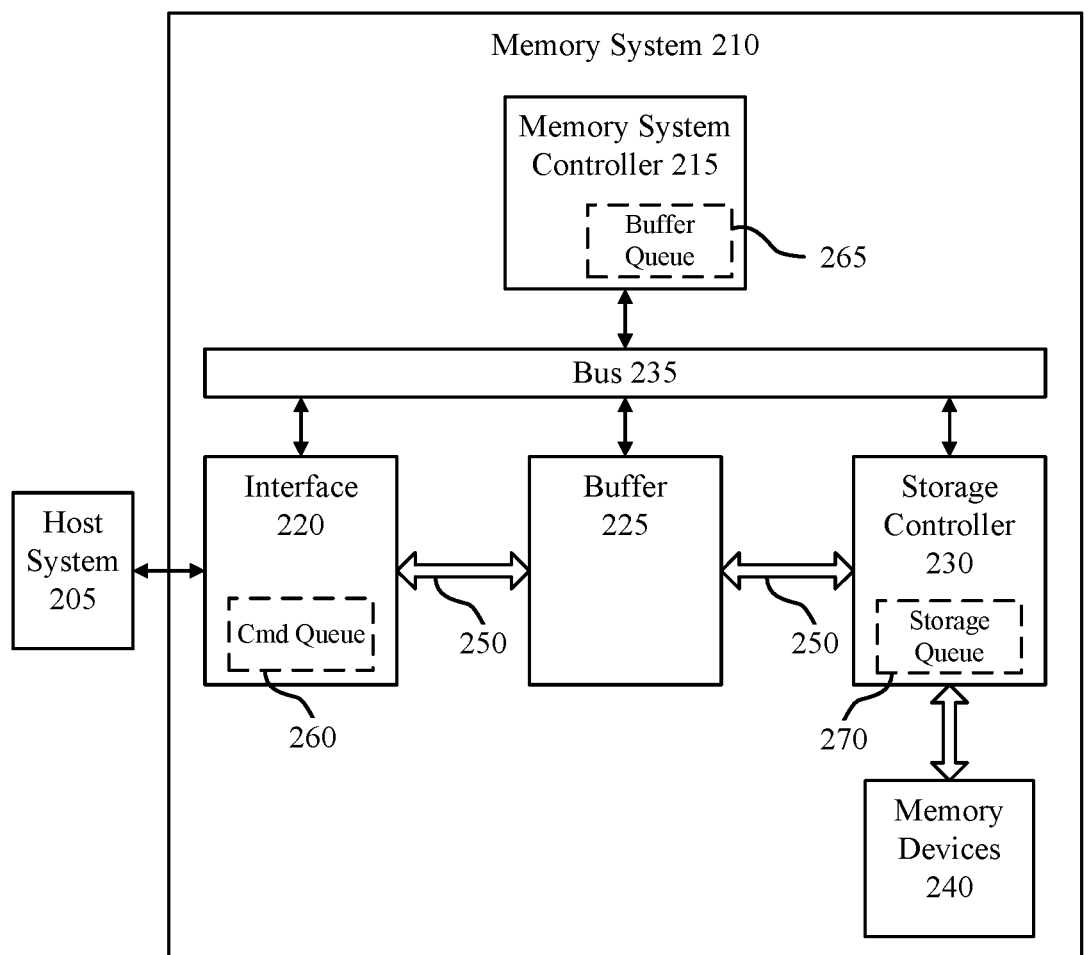
FIG. 2 illustrates an example of a system that supports advanced power off notification for managed memory in accordance with examples as disclosed herein.

FIG. 2 illustrates an example of a system 200 that supports advanced power off notification for managed memory in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some examples, the memory system controller 215 may receive a power off notification from the host system 205 that indicates the memory system 210 will soon be deactivated. The memory system controller 215 may be configured to perform background operations between the duration of receiving the power off notification and the deactivation. When the memory system controller 215 is unaware of how much time remains, the memory system controller 215 may be unable to fully take advantage of this period.

As described herein, the memory system controller 215 may receive a power off notification from the host system 205 that also includes a value indicating the amount of time remaining until the power of the memory system 210 is deactivated (e.g., indicating that power will remain for at least the amount of time indicated by the value). By knowing the minimum amount of time remaining, the memory system controller 215 may be able to determine the background operations, or an order for background operations to be performed—e.g., if there is a relatively long time remaining, the memory system controller 215 may perform more or relatively longer background operations. The memory system controller 215 may also be configured to transmit a response to the notification that includes a second time the memory system controller 215 estimates it needs to complete certain background operations. The host system 205 may either accept the second time and transmit a second power off notification with the second time or maintain the original time indicated.

Figure 3:
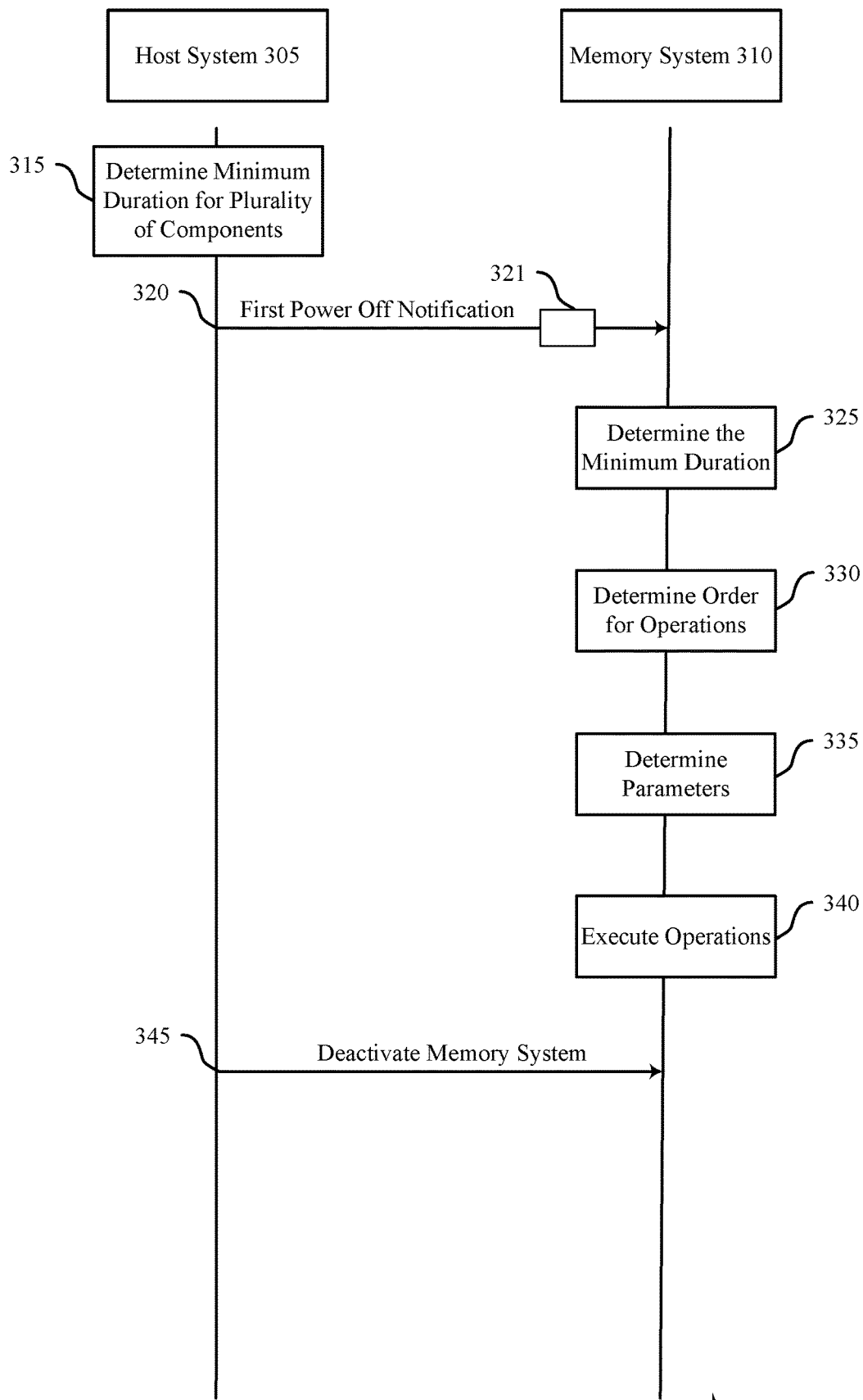
FIG. 3 illustrates an example of a process flow diagram that supports advanced power off notification for managed memory in accordance with examples as disclosed herein.

FIG. 3 illustrates an example of a process flow 300 that supports advanced power off notification for managed memory in accordance with examples as disclosed herein. Process flow 300 may include a host system 305 and a memory system 310, which may be respective examples of a host system 105 and a memory system 110 as described with reference to FIG. 1. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. The process flow 300 illustrates examples for a host system providing a power off notification with a time remaining until the power of the memory system is deactivated, enabling the memory system to perform background operations with a reduced risk of the operation being suspended.

At 315, a minimum duration for a plurality of components is determined. For example, a host system 305 (e.g., host system 105 as described with reference to FIG. 1) may determine a minimum duration for a plurality of components to power off. In some examples, the host system 305 may include a system on chip (SOC) and a power management component. In such examples, the power management component may determine a minimum duration for a plurality of components in the host system 305 to transition from a first power state to a second power state—e.g., from a power on state to a power off state. For example, the host system 305 may be included in an automobile. In such cases, the host system 305 power management component may determine a minimum duration to turn off components in the automobile like headlights, brake lights, display, door lights, etc. The host system 305 may also determine the minimum duration based on the time it will take the host system 305 to perform housekeeping operations—e.g., maintenance of data at the host system.

Host system 305 may then send first power off notification 320 to memory system 310. For example, a memory system 310 (e.g., memory system 110 as described with reference to FIG. 1) may receive the first power off notification 320 from the host system 305. The first power off notification 320 may be received at the memory system controller (e.g., memory system controller 115 as described with reference to FIG. 1). In some examples, the host system 305 may transmit the first power off notification 320 to indicate that the memory system 310 is to transition from a first state to a second state. For example, the first power notification may place the memory system 310 in a transition state between normal operations and a deactivated or unpowered state. That is, during the second state, the host system 305 may refrain from communicating with the memory system 310 and instead continue to power off the plurality of components or perform the housekeeping operations. The host system 305 may also transmit the first power off notification 320 with a value 321 that corresponds to the minimum duration. In such cases, the host system 305 may indicate a minimum amount of time remaining until a power supply of the memory system 310 is deactivated—e.g., the memory system 310 is turned off. That is, the host system 305 may not immediately power down the memory system 310. In some examples, the value 321 may comprise a plurality of bits. That is, the host system 305 may utilize reserved bits of the first power off notification to indicate the minimum amount of time remaining. As the value indicates time values, the host system 305 may utilize multiple bits to convey the information. In some cases, the host system 305 may also encode the value.

At 325, the minimum duration may be determined. For example, the memory system 310 may determine the minimum duration based on the value 321 received from the host system 305. The minimum duration may be determined at the memory system controller. In some examples, the host system 305 may transmit an index to the amount of time remaining until the power supply of the memory array is deactivated (e.g., an index to a table of preconfigured values). That is, the host system 305 may select the time budget from one of multiple (three or more) time values based on the determining the minimum duration. Accordingly, the memory system 310 may receive the value and determine the minimum duration (e.g., the time budget) remaining until the power supply is deactivated. For example, the memory system 310 may identify the minimum duration based on reading a table that stores a plurality of minimum durations at one or more registers of the memory system 310. That is, the table may include at least three or more minimum durations and the memory system 310 may determine the minimum duration received from the host system 305 by selecting an entry of the table using the value received. The host system 305 may have previously configured the table of values, in some cases. In other examples, the memory system 310 may determine the minimum duration by converting a numeric value 321 (e.g., multiplying the numeric value by a factor). For example, the numeric value 321 may include two or more bits, and the memory system 310 may multiply the number given by the two or more bits by a factor to obtain the minimum duration in time. By determining the minimum duration, the memory system 310 may determine the time remaining until the power supply is deactivated. The memory system 310 may reduce the risk of an operation being performed after receiving the first power off notification 320 by taking advantage of the minimum duration and time value received from the host system 305.

At 330, an order for operations may be determined. For example, the memory system 310 may determine an order to perform operations based on the value received from the host system 305. The order to execute the operations may be determined at the memory system controller. In some examples, the memory system 310 may perform background operations like garbage collection, refresh of data, or folding of data from SLC to TLC blocks. By receiving the value and determining the minimum duration, the memory system 310 may determine an order to execute the plurality of background operations. For example, the memory system 310 may determine the order based on the time budget received from the host system 305—e.g., if the time budget is relatively long, the memory system 310 may perform more background operations, or background operations that take a longer amount of time. Conversely, when the time budget is relatively short, the memory system 310 may perform background operations that take a shorter amount of time. The memory system 310 may also determine the order of the operations based on maintaining data. For example, the memory system 310 may prioritize movement of data from the cache to the main array to avoid losing the data while deactivated—e.g., moving data from volatile cells to non-volatile cells to avoid losing data when the power supply is deactivated. The memory system 310 may also determine the order based on a parameter associated with a memory array of the memory system 310.

At 335, a parameter may be determined. For example, the memory system 310 may determine a parameter while determining an order for the operations. The parameter may be determined at the memory system controller. In some examples, the memory system 310 may determine a parameter before, after, or during the determination of the order to execute the operations in. That is, step 335 may be before 330, concurrent with 330, or after 330. The memory system 310 may utilize the parameter to determine the order. For example, the memory system 310 may determine the parameter by detecting a temperature of memory cells within the memory system 310. In some cases, the memory system 310 may determine significant temperature changes from the temperature when the memory cells were written and the temperature at the time of receiving the power off notification. Accordingly, the memory system 310 may copy data stored in the memory cells associated with the temperature change first before performing other housekeeping operations.

In other examples, the memory system 310 may determine the parameter by determining a quantity of programmed erase cycles (e.g., erase operations) associated with the memory cells. In some cases, the memory system 310 may perform housekeeping operations (e.g., refreshing data) on memory cells that have been erased a relatively higher quantity of times before performing housekeeping operations on memory cells that have been erased a relatively lower quantity of times. Additionally or alternatively, the memory system 310 may determine the parameter by determining a quantity of blocks in the memory system 310 that are to be refreshed or garbage collected. If the memory system 310 determines there is a relatively high quantity of blocks to be refreshed or to be garbage collected, the memory system 310 may perform refresh and garbage collection operations first. In other cases, the memory system 310 may determine the parameter by determining an average duration the power supply of the memory system 310 is deactivated. That is, the memory system 310 may determine the amount of time the memory system 310 is deactivated on average. If the memory system 310 is deactivated for relatively long periods of time, the memory system 310 may perform refresh operations more periodically—e.g., the memory system 310 may prioritize refresh operations to ensure the maintenance of the data.

At 340, the operations may be executed. For example, the memory system 310 may execute operations based on the determined order at 330. The operations may be executed by the memory system controller. The memory system 310 may execute the housekeeping operations after determining the order. For example, the memory system 310 may perform garbage collection operations, transfer data stored at the cache to the memory array, perform data folding, perform refresh operations, etc.

At 345, the memory system 310 may be deactivated. For example, the host system 305 may deactivate the memory system 310. In some examples, the host system 305 may deactivate (e.g., turn off or remove) the power supply of the memory system 310 after the minimum duration. The host system 305 may also transition the plurality of components from the first power state to the second power state—e.g., power off the plurality of components. In some examples, the memory system 310 may be performing an operation while the power supply is deactivated. In such examples, the memory system 310 may suspend the operation. In some examples, the memory system 310 may subsequently be activated by the host system 305. The memory system 310 may eventually receive a second power off notification that comprises a second value corresponding to a second minimum duration. In such examples, the memory system 310 may determine the second minimum duration as described at 325. The memory system 310 may also determine the order of operations as described at 330. In examples where an operation was suspended after the host system 305 deactivated the memory system 310 at 345, the memory system 310 may determine the order based on the suspended operation. For example, the memory system 310 may execute the suspended operation first before executing other housekeeping operations during the second minimum duration.

Figure 4:
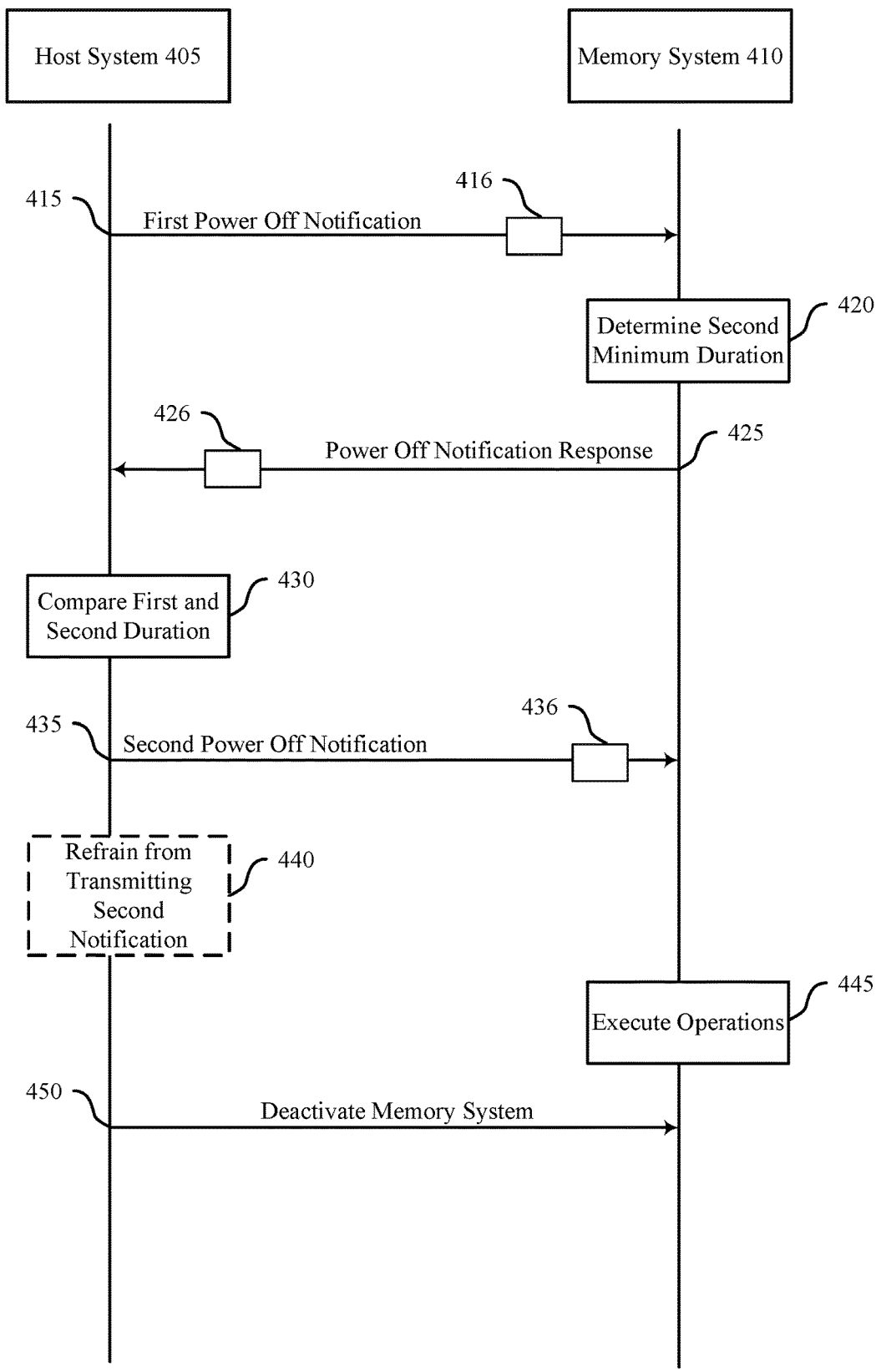
FIG. 4 illustrates an example of a process flow diagram that supports advanced power off notification for managed memory in accordance with examples as disclosed herein.

FIG. 4 illustrates an example of a process flow 400 that supports advanced power off notification for managed memory in accordance with examples as disclosed herein. Process flow 400 may include a host system 405 and a memory system 410, which may be respective examples of a host system 105 and a memory system 110 as described with reference to FIG. 1. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process flows are possible. The process flow 400 illustrates examples for a host system providing a power off notification with a time remaining until the power of the memory system is deactivated and the memory system responding back with a second time that it will utilize to perform the housekeeping operations.

The host system may transmit a first power off notification 415 to the memory system 410 with a first minimum duration. The memory system 410 (e.g., memory system 110 as described with reference to FIG. 1) may receive the first power off notification 415 from the host system 405 (e.g., host system 105 as described with reference to FIG. 1). The first power off notification 415 may be received at the memory system controller (e.g., memory system controller 115 as described with reference to FIG. 1). As described with reference to FIG. 3 the host system 405 may determine a first minimum duration to power down a plurality of components and transmit a power down notification that includes a value 416 associated with a time remaining until the power of the memory system is deactivated. The host system 405 may also transition the memory system 410 from a first state to a second state as described with reference to FIG. 3.

At 420, a second minimum duration may be determined. For example, the memory system 410 may determine a second minimum duration. The determination may be made at the memory system controller. In some examples, the memory system 410 may determine a duration to perform scheduled background operations—e.g., how long the memory system 410 needs to perform background operations in this power cycle. For example, the memory system 410 may determine a duration to perform refresh operations, to perform folding of data from SLC to TLC blocks, or to perform garbage collection operations. In some examples, the memory system 410 may determine the second minimum duration in a process similar to determining the order to execute a plurality of operations as described with reference to FIG. 3. For example, the memory system 410 may utilize a parameter to determine the second minimum duration. The parameter may be based on a temperature of a memory array in the memory system, a quantity of programmed erase cycles performed at the memory array, a quantity of blocks to undergo garbage collection, or an average duration the memory system 410 is deactivated (e.g., is in a power off state).

The memory system 410 may transmit a power off notification response 425 including a second minimum duration 426 to the host system 405. By transmitting the power off notification response 415, the memory system 410 may indicate to the host system 405 a second minimum duration 426 the memory system 410 is requesting to perform background operations—e.g., the amount of time the memory system 410 will need to perform background operations.

At 430, the first minimum duration and the second minimum duration may be compared. For example, the host system 405 may compare the first minimum duration and the second minimum duration. In some examples, the host system 405 may determine that the memory system 410 is requesting less time than the host system 405 initially provided—e.g., the host system 405 may determine the second minimum duration is less than the first minimum duration. In such examples, the host system 405 may proceed to step 440. In other examples, the host system 405 may determine the memory system 410 is requesting more time than the host system 405 initially provided—e.g., the host system 405 may determine the second minimum duration is greater than the first minimum duration. In such examples, the host system 405 may either ignore the second minimum duration (e.g., keep the initial minimum duration) and proceed to step 440 or the host system 405 may accept the second minimum duration.

If the host system 405 accepts the second minimum duration, the host system 405 may send a second power off notification 435 with a third minimum duration 436 to the memory system 410. The second power off notification 435 may be received at the memory system controller. The third minimum duration may be the same as the second minimum duration, in some cases. In some examples, the memory system 410 may also transmit a second power off notification response to the host system 405 after receiving the second power off notification 435. That is, the memory system 410 may transmit a response to indicate to the host system 405 that the host system 405 may deactivate the power supply of the memory system after the third minimum duration.

At 440, a second notification may not be transmitted. For example, the host system 405 may refrain from transmitting a second power off notification to the memory system 410. In some examples, the host system 405 may refrain from transmitting a second power off notification with the second minimum duration requested by the memory system 410 based on the first minimum duration exceeding the second minimum duration. That is, the host system 405 may determine the memory system 410 has ample time to perform the background operations and additional time is not needed. Accordingly, the host system 405 may not transmit additional notifications and continue to power down the plurality of components as described with reference to FIG. 3. In other examples, the host system 405 may refrain from transmitting a second notification even if the second minimum duration exceeds the first minimum duration. That is, the host system 405 may ignore the request by the memory system 410.

At 445, operations may be executed by the memory system 410. For example, the memory system 410 may execute the background or housekeeping operations. The operations may be initiated by the memory system controller. In some examples, the memory system 410 may receive the second power off notification 435. In such examples, the memory system 410 may execute the operations it requested to complete—e.g., the operations the memory system 410 utilized to determine the second minimum duration. In other examples, the memory system 410 may determine an absence of a second power off notification. When the memory system 410 determines an absence of the second power off notification, it may modify the operations for execution at 445 to complete the operations with the first minimum duration and value 416. When the memory system 410 determines the second minimum duration is less than the first minimum duration, the memory system 410 may proceed to execute the plurality of operations normally—e.g., with low risk of an operation being interrupted or suspended by the deactivation of the memory system 410 power supply. The memory system 410 may determine an order to execute the operations as described with reference to FIG. 3. When the memory system 410 determines the second minimum duration is greater than the first minimum duration (e.g., and in the absence of receiving a second power off notification), the memory system 410 may first determine an order to execute the operations. That is, the memory system 410 may determine there is not enough time to complete all the operations and prioritize certain operations first—e.g., transferring data from the cache to the memory array. The memory system 410 may determine the order as described with reference to FIG. 3. The memory system 410 may then execute the operations. If an operation is suspended (e.g., the power supply is deactivated while the memory system 410 performs an operation), the memory system 410 may proceed as described with reference to FIG. 3—e.g., determine an order to a subsequent power off notification by taking into account the suspended operation.

At 450, the memory system may be deactivated. For example, the host system 405 may deactivate the memory system 410. In some examples, the host system 450 may deactivate the memory system 410 by removing or deactivating the power supply of the memory system 410. In examples where the host system 405 refrained from transmitting a second notification, the host system 405 may deactivate the power supply after the first minimum duration. In examples where the host system 405 transmitted the second notification, the host system 405 may deactivate the power supply after the second minimum duration.

Figure 5:
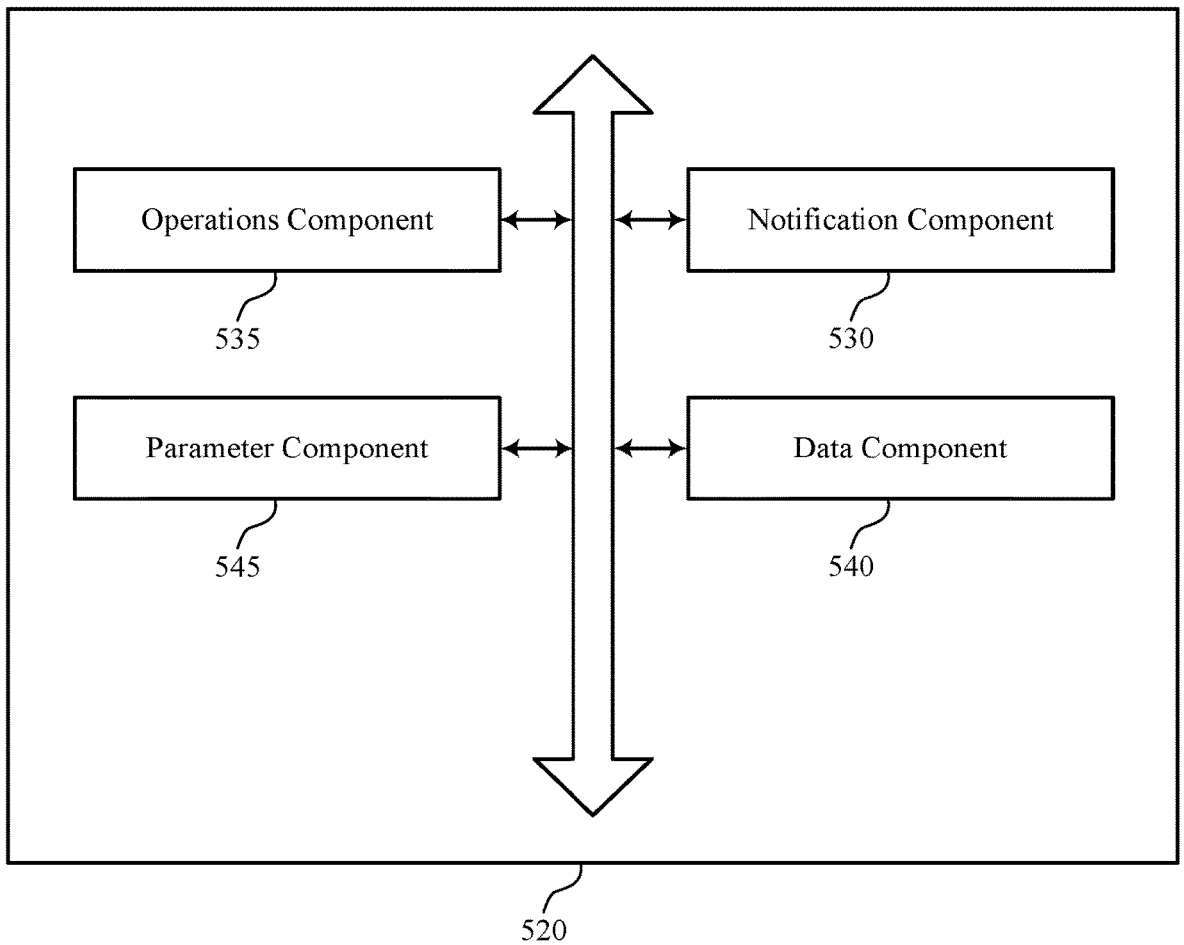
FIG. 5 shows a block diagram of a managed memory system controller that supports advanced power off notification for managed memory in accordance with examples as disclosed herein.

FIG. 5 shows a block diagram 500 of a managed memory system controller 520 that supports advanced power off notification for managed memory in accordance with examples as disclosed herein. The managed memory system controller 520 may be an example of aspects of a managed memory system controller as described with reference to FIGS. 1 through 4. The managed memory system controller 520, or various components thereof, may be an example of means for performing various aspects of advanced power off notification for managed memory as described herein. For example, the managed memory system controller 520 may include a notification component 530, an operations component 535, a data component 540, a parameter component 545, or any combination thereof. Each of these components may communicate, directly or indirectly, with one another (e.g., via one or more buses).

The notification component 530 may be configured as or otherwise support a means for receiving, at a controller coupled with a memory array including a plurality of memory cells, a notification indicating a transition from a first state of the memory array to a second state of the memory array, the notification including a value, the value including a plurality of bits and corresponding to a minimum duration remaining until a power supply of the memory array is deactivated. In some cases, the notification component 530 may be configured as or otherwise support a means for receiving a second notification indicating the transition from the first state to the second state of the memory array, the notification including a second value corresponding to a second minimum duration remaining until the power supply of the memory array is deactivated.

The operations component 535 may be configured as or otherwise support a means for executing a plurality of operations according to an order determined based at least in part on a parameter associated with the memory array and receiving the notification including the value. In some instances, the plurality of operations executed by the operations component 535 may be associated with maintenance of data stored at the plurality of memory cells. In some examples, the operations component 535 may be configured as or otherwise support a means for suspending an operation of the plurality of operations based at least in part on expiration of the minimum duration remaining until the power supply of the memory array is deactivated.

In some cases, the operations component 535 may be configured as or otherwise support a means for initializing the memory array after a second duration based at least in part on the power supply of the memory array being activated. In some instances, the operations component 535 may be configured as or otherwise support a means for executing a second plurality of operations in the second minimum duration according to a second order determined based at least in part on the parameter and receiving the notification and the value, where the second plurality of operations includes the operation of the plurality of operations and where the second order is based at least in part on suspending the operation.

In some examples, the data component 540 may be configured as or otherwise support a means for transferring data stored at a cache, coupled with the memory array, to the memory array based at least in part on receiving the notification.

In some instances, the parameter component 545 may be configured as or otherwise support a means for detecting a temperature of the plurality of memory cells, where the parameter is based at least in part on the temperature of the plurality of memory cells. In some cases, the parameter component 545 may be configured as or otherwise support a means for determining a quantity of erase operations executed at the memory array, where the parameter is based at least in part on the quantity of erase operations. In some examples, the parameter component 545 may be configured as or otherwise support a means for determining a quantity of blocks of a plurality of blocks in the memory array associated with a memory organization operation, where the parameter is based at least in part on the quantity of blocks.

In some instances, the parameter component 545 may be configured as or otherwise support a means for determining an average duration the power supply of the memory array is deactivated, where the parameter is based at least in part on the average duration. In some cases, the parameter component 545 may be configured as or otherwise support a means for identifying the minimum duration from a plurality of minimum durations based at least in part on receiving the value, where the plurality of minimum durations includes at least the minimum duration, a second minimum duration, and a third minimum duration. In some instances, the parameter component 545 may be configured as or otherwise support a means for determining the minimum duration based at least in part on reading a table stored at a register, the register storing the plurality of minimum durations.

Figure 6:
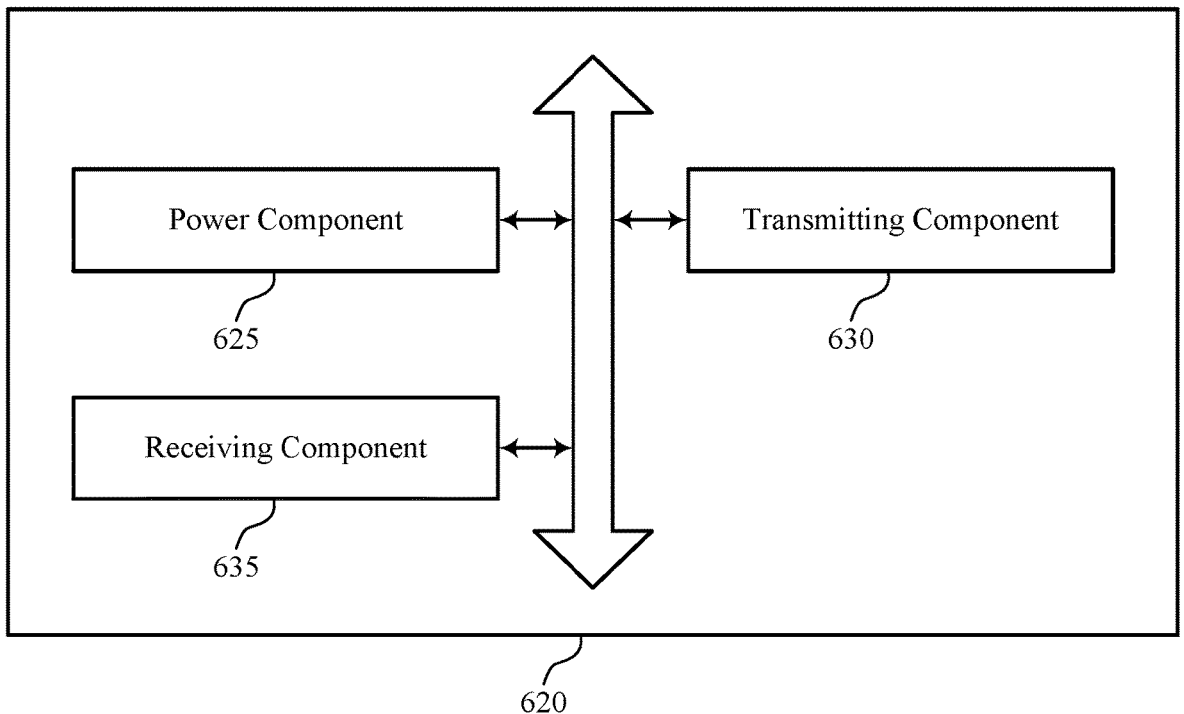
FIG. 6 shows a block diagram of a host system controller that supports advanced power off notification for managed memory in accordance with examples as disclosed herein.

FIG. 6 shows a block diagram 600 of a host system controller 620 that supports advanced power off notification for managed memory in accordance with examples as disclosed herein. The host system controller 620 may be an example of aspects of a host system controller as described with reference to FIGS. 1 through 4. The host system controller 620, or various components thereof, may be an example of means for performing various aspects of advanced power off notification for managed memory as described herein. For example, the host system controller 620 may include a power component 625, a transmitting component 630, a receiving component 635, or any combination thereof. Each of these components may communicate, directly or indirectly, with one another (e.g., via one or more buses).

The power component 625 may be configured as or otherwise support a means for determining a minimum duration to transition a plurality of components configured to perform operations from a first power state to a second power state. In some cases, the power component 625 may be configured as or otherwise support a means for transitioning the plurality of components from the first power state to the second power state and deactivating the power supply of the memory system after the minimum duration based at least in part on transmitting the notification. In some instances, the power component 625 may be configured as or otherwise support a means for determining the second value is greater than the value based at least in part on receiving the response from the memory system.

In some examples, the power component 625 may be configured as or otherwise support a means for deactivating the power supply of the memory system after the second minimum duration based at least in part on transmitting the second notification.

In some examples, the power component 625 may be configured as or otherwise support a means for determining the second value is greater than the value based at least in part on receiving the response from the memory system. In some instances, the power component 625 may be configured as or otherwise support a means for determining the second value is less than the value based at least in part on receiving the response from the memory system. In some examples, the power component 625 may be configured as or otherwise support a means for deactivating the power supply of the memory system after the minimum duration based at least in part on determining the second value.

The transmitting component 630 may be configured as or otherwise support a means for transmitting, to a memory system, a notification indicating a transition from a first state to a second state of the memory system, the notification including a value corresponding to the minimum duration, where the value indicates the minimum duration remaining until a power supply of the memory system is deactivated. In some instances, the transmitting component 630 may be configured as or otherwise support a means for refraining from transmitting a command to the memory system prior to deactivation of the power supply of the memory system based at least in part on transmitting the notification to the memory system. In some cases, the transmitting component 630 may be configured as or otherwise support a means for transmitting a second notification to the memory system, the second notification including the second value indicating the second minimum duration remaining until the power supply of the memory system is deactivated. In some instances, the transmitting component 630 may be configured as or otherwise support a means for refraining from transmitting a second notification to the memory system and deactivate the power supply after the minimum duration based at least in part on determining the second value.

In some cases, the receiving component 635 may be configured as or otherwise support a means for receiving a response from the memory system after transmitting the notification, the response including a second value corresponding to a second minimum duration associated with executing a plurality of operations at the memory system.

Figure 7:
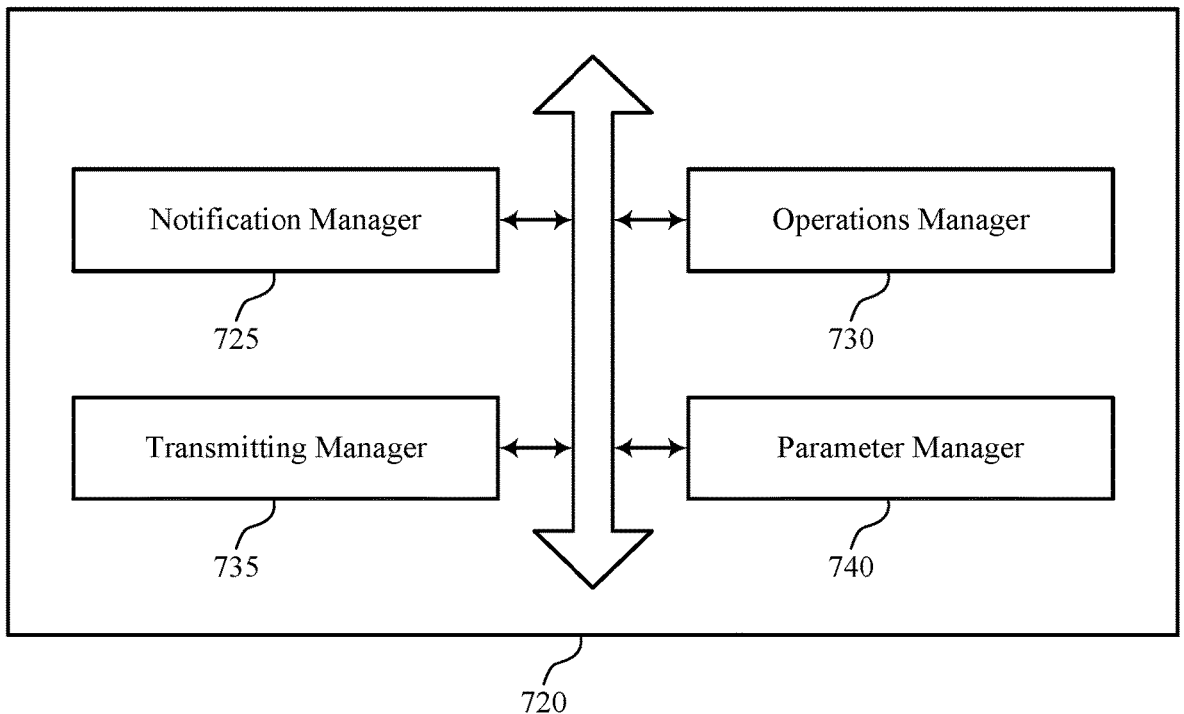
FIG. 7 shows a block diagram of a memory system controller that supports advanced power off notification for managed memory in accordance with examples as disclosed herein.

FIG. 7 shows a block diagram 700 of a memory system controller 720 that supports advanced power off notification for managed memory in accordance with examples as disclosed herein. The memory system controller 720 may be an example of aspects of a memory system controller as described with reference to FIGS. 1 through 4. The memory system controller 720, or various components thereof, may be an example of means for performing various aspects of advanced power off notification for managed memory as described herein. For example, the memory system controller 720 may include a notification manager 725, an operations manager 730, a transmitting manager 735, a parameter manager 740, or any combination thereof. Each of these components may communicate, directly or indirectly, with one another (e.g., via one or more buses).

The notification manager 725 may be configured as or otherwise support a means for receiving, at a controller, a notification indicating a transition from a first state to a second state for a memory array including a plurality of memory cells storing a set of data, the notification including a first value corresponding to a first minimum duration remaining until a power supply of the memory array is deactivated. In some cases, the notification manager 725 may be configured as or otherwise support a means for receiving a second notification, the second notification including the second value corresponding to the second minimum duration remaining until the power supply of the memory array is deactivated.

In some instances, the notification manager 725 may be configured as or otherwise support a means for determining an absence of a second notification including the second value corresponding to the second minimum duration. In some examples, the notification manager 725 may be configured as or otherwise support a means for determining an absence of a second notification including the second value corresponding to the second minimum duration.

The operations manager 730 may be configured as or otherwise support a means for determining a second minimum duration to perform a plurality of operations associated with a maintenance of the set of data. In some instances, the operations manager 730 may be configured as or otherwise support a means for executing a quantity of operations according to an order determined based at least in part on determining the absence of the second notification and determining the second minimum duration exceeds the first minimum duration. In some cases, the operations manager 730 may be configured as or otherwise support a means for executing the plurality of operations in the second minimum duration based at least in part on identifying the second minimum duration is less than the first minimum duration.

The transmitting manager 735 may be configured as or otherwise support a means for transmitting a response based at least in part on determining the second minimum duration, where the response includes a second value corresponding to the second minimum duration to perform the plurality of operations.

In some instances, the parameter manager 740 may be configured as or otherwise support a means for determining a parameter associated with the memory array, where the controller is configured to determine the second minimum duration based at least in part on the parameter. In some cases, the parameter manager 740 may be configured to determine the parameter which is associated with a temperature of the memory array, a quantity of erase operations executed at the memory array, a quantity of blocks of a plurality of blocks in the memory array associated with a memory organization operation, or an average duration the power supply of the memory array is deactivated.

Figure 8:
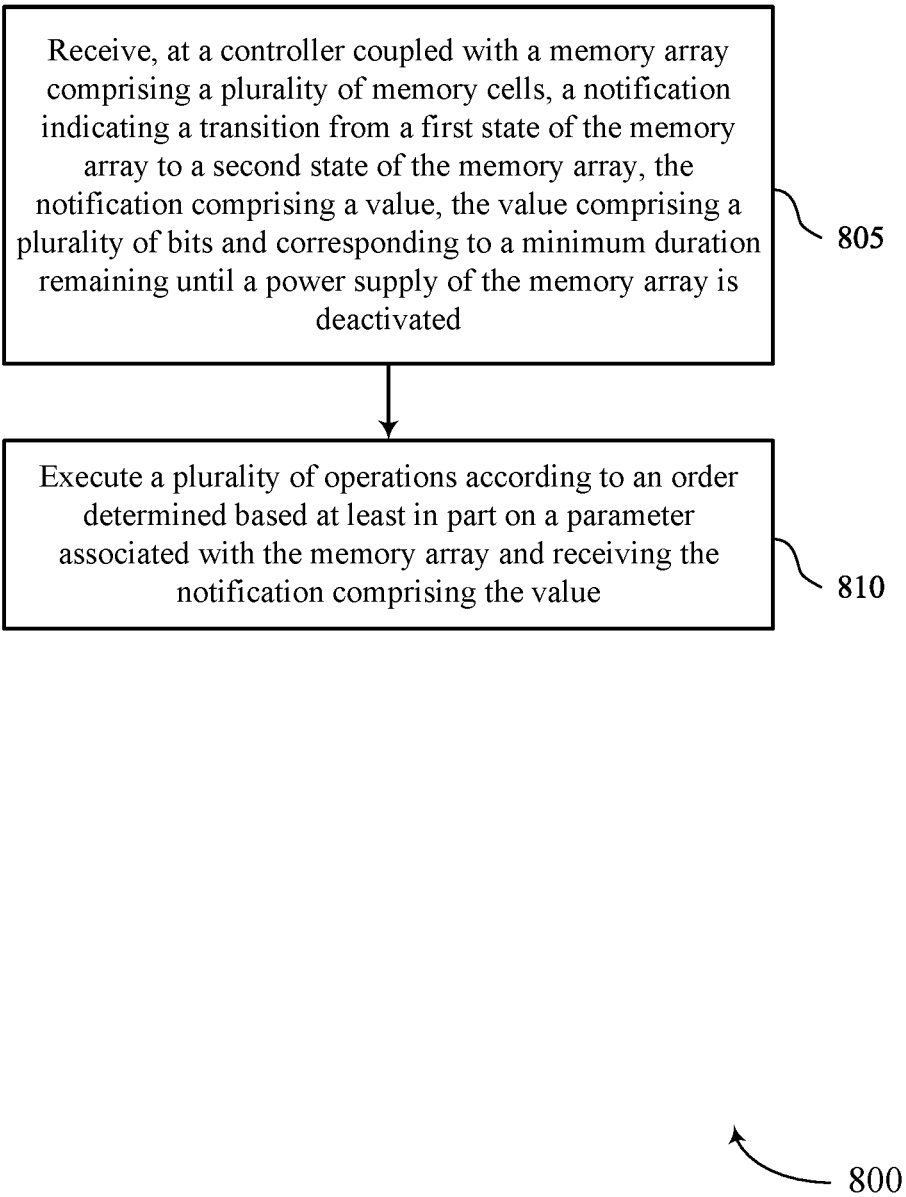
FIGS. 8 through 10 show flowcharts illustrating a method or methods that support advanced power off notification for managed memory in accordance with examples as disclosed herein.

FIG. 8 shows a flowchart illustrating a method 800 that supports advanced power off notification for managed memory in accordance with examples as disclosed herein. The operations of method 800 may be implemented by a managed memory system controller or its components as described herein. For example, the operations of method 800 may be performed by a managed memory system controller as described with reference to FIGS. 1 through 5. In some examples, a managed memory system controller may execute a set of instructions to control the functional elements of the device to perform the described functions. Additionally or alternatively, the managed memory system controller may perform aspects of the described functions using special-purpose hardware.

At 805, the method may include receiving, at a controller coupled with a memory array including a plurality of memory cells, a notification indicating a transition from a first state of the memory array to a second state of the memory array, the notification including a value, the value including a plurality of bits and corresponding to a minimum duration remaining until a power supply of the memory array is deactivated. The operations of 805 may be performed in accordance with examples as disclosed herein. In some examples, aspects of the operations of 805 may be performed by a notification component 530 as described with reference to FIG. 5.

At 810, the method may include executing a plurality of operations according to an order determined based at least in part on a parameter associated with the memory array and receiving the notification including the value. The operations of 810 may be performed in accordance with examples as disclosed herein. In some examples, aspects of the operations of 810 may be performed by an operations component 535 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, at a controller coupled with a memory array including a plurality of memory cells, a notification indicating a transition from a first state of the memory array to a second state of the memory array, the notification including a value, the value including a plurality of bits and corresponding to a minimum duration remaining until a power supply of the memory array is deactivated and executing a plurality of operations according to an order determined based at least in part on a parameter associated with the memory array and receiving the notification including the value.

In some examples of the method 800 and the apparatus described herein, the plurality of operations may be associated with maintenance of data stored at the plurality of memory cells.

In some instances of the method 800 and the apparatus described herein, and the method, apparatuses, and non-transitory computer-readable medium may include further operations, features, circuitry, logic, means, or instructions for transferring data stored at a cache, coupled with the memory array, to the memory array based at least in part on receiving the notification.

Some cases of the method 800 and the apparatus described herein may further include operations, features, circuitry, logic, means, or instructions for detecting a temperature of the plurality of memory cells, where the parameter may be based at least in part on the temperature of the plurality of memory cells.

Some instances of the method 800 and the apparatus described herein may further include operations, features, circuitry, logic, means, or instructions for determining a quantity of erase operations executed at the memory array, where the parameter may be based at least in part on the quantity of erase operations.

Some examples of the method 800 and the apparatus described herein may further include operations, features, circuitry, logic, means, or instructions for determining a quantity of blocks of a plurality of blocks in the memory array associated with a memory organization operation, where the parameter may be based at least in part on the quantity of blocks.

Some instances of the method 800 and the apparatus described herein may further include operations, features, circuitry, logic, means, or instructions for determining an average duration the power supply of the memory array may be deactivated, where the parameter may be based at least in part on the average duration.

Some cases of the method 800 and the apparatus described herein may further include operations, features, circuitry, logic, means, or instructions for suspending an operation of the plurality of operations based at least in part on expiration of the minimum duration remaining until the power supply of the memory array may be deactivated, initializing the memory array after a second duration based at least in part on the power supply of the memory array being activated, receiving a second notification indicating the transition from the first state to the second state of the memory array, the notification including a second value corresponding to a second minimum duration remaining until the power supply of the memory array may be deactivated, and executing a second plurality of operations in the second minimum duration according to a second order determined based at least in part on the parameter and receiving the notification and the value, where the second plurality of operations includes the operation of the plurality of operations and where the second order may be based at least in part on suspending the operation.

Some instances of the method 800 and the apparatus described herein may further include operations, features, circuitry, logic, means, or instructions for identifying the minimum duration from a plurality of minimum durations based at least in part on receiving the value, where the plurality of minimum durations includes at least the minimum duration, a second minimum duration, and a third minimum duration.

Some cases of the method 800 and the apparatus described herein may further include operations, features, circuitry, logic, means, or instructions for determining the minimum duration based at least in part on reading a table stored at a register, the register storing the plurality of minimum durations.

Figure 9:
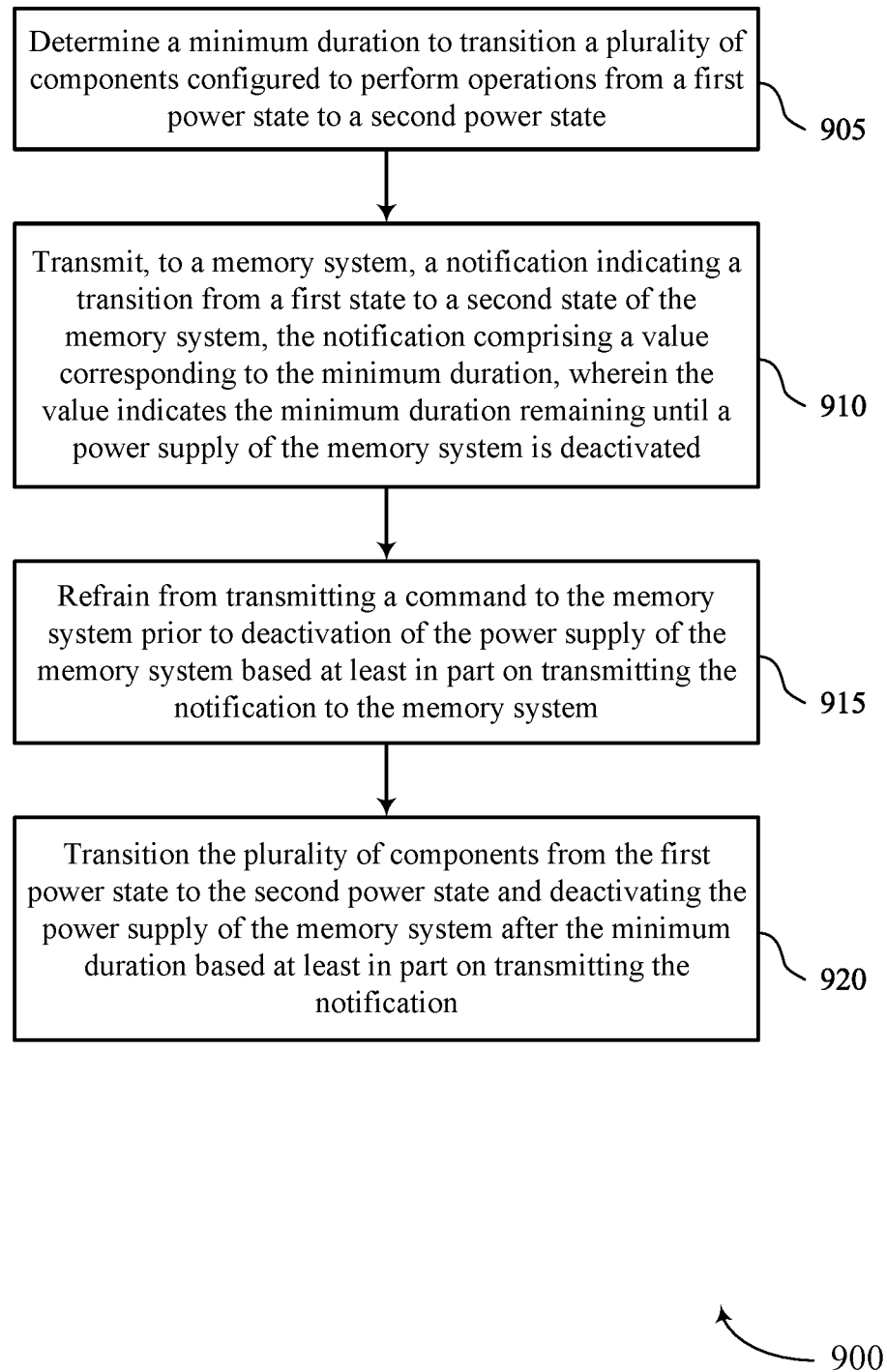

FIG. 9 shows a flowchart illustrating a method 900 that supports advanced power off notification for managed memory in accordance with examples as disclosed herein. The operations of method 900 may be implemented by a host system controller or its components as described herein. For example, the operations of method 900 may be performed by a host system controller as described with reference to FIGS. 1 through 4 and 6. In some examples, a host system controller may execute a set of instructions to control the functional elements of the device to perform the described functions. Additionally or alternatively, the host system controller may perform aspects of the described functions using special-purpose hardware.

At 905, the method may include determining a minimum duration to transition a plurality of components configured to perform operations from a first power state to a second power state. The operations of 905 may be performed in accordance with examples as disclosed herein. In some examples, aspects of the operations of 905 may be performed by a power component 625 as described with reference to FIG. 6.

At 910, the method may include transmitting, to a memory system, a notification indicating a transition from a first state to a second state of the memory system, the notification including a value corresponding to the minimum duration, where the value indicates the minimum duration remaining until a power supply of the memory system is deactivated. The operations of 910 may be performed in accordance with examples as disclosed herein. In some examples, aspects of the operations of 910 may be performed by a transmitting component 630 as described with reference to FIG. 6.

At 915, the method may include refraining from transmitting a command to the memory system prior to deactivation of the power supply of the memory system based at least in part on transmitting the notification to the memory system. The operations of 915 may be performed in accordance with examples as disclosed herein. In some examples, aspects of the operations of 915 may be performed by a transmitting component 630 as described with reference to FIG. 6.

At 920, the method may include transitioning the plurality of components from the first power state to the second power state and deactivating the power supply of the memory system after the minimum duration based at least in part on transmitting the notification. The operations of 920 may be performed in accordance with examples as disclosed herein. In some examples, aspects of the operations of 920 may be performed by a power component 625 as described with reference to FIG. 6.

In some examples, an apparatus as described herein may perform a method or methods, such as the method 900. The apparatus may include, features, circuitry, logic, means, or instructions (e.g., a non-transitory computer-readable medium storing instructions executable by a processor) for determining a minimum duration to transition a plurality of components configured to perform operations from a first power state to a second power state, transmitting, to a memory system, a notification indicating a transition from a first state to a second state of the memory system, the notification including a value corresponding to the minimum duration, where the value indicates the minimum duration remaining until a power supply of the memory system is deactivated, refraining from transmitting a command to the memory system prior to deactivation of the power supply of the memory system based at least in part on transmitting the notification to the memory system, and transitioning the plurality of components from the first power state to the second power state and deactivating the power supply of the memory system after the minimum duration based at least in part on transmitting the notification.

Some instances of the method 900 and the apparatus described herein may further include operations, features, circuitry, logic, means, or instructions for receiving a response from the memory system after transmitting the notification, the response including a second value corresponding to a second minimum duration associated with executing a plurality of operations at the memory system.

Some cases of the method 900 and the apparatus described herein may further include operations, features, circuitry, logic, means, or instructions for determining the second value may be greater than the value based at least in part on receiving the response from the memory system, transmitting a second notification to the memory system, the second notification including the second value indicating the second minimum duration remaining until the power supply of the memory system may be deactivated, and deactivating the power supply of the memory system after the second minimum duration based at least in part on transmitting the second notification.

Some instances of the method 900 and the apparatus described herein may further include operations, features, circuitry, logic, means, or instructions for determining the second value may be greater than the value based at least in part on receiving the response from the memory system and refraining from transmitting a second notification to the memory system and deactivate the power supply after the minimum duration based at least in part on determining the second value.

Some examples of the method 900 and the apparatus described herein may further include operations, features, circuitry, logic, means, or instructions for determining the second value may be less than the value based at least in part on receiving the response from the memory system and deactivating the power supply of the memory system after the minimum duration based at least in part on determining the second value.

Figure 10:
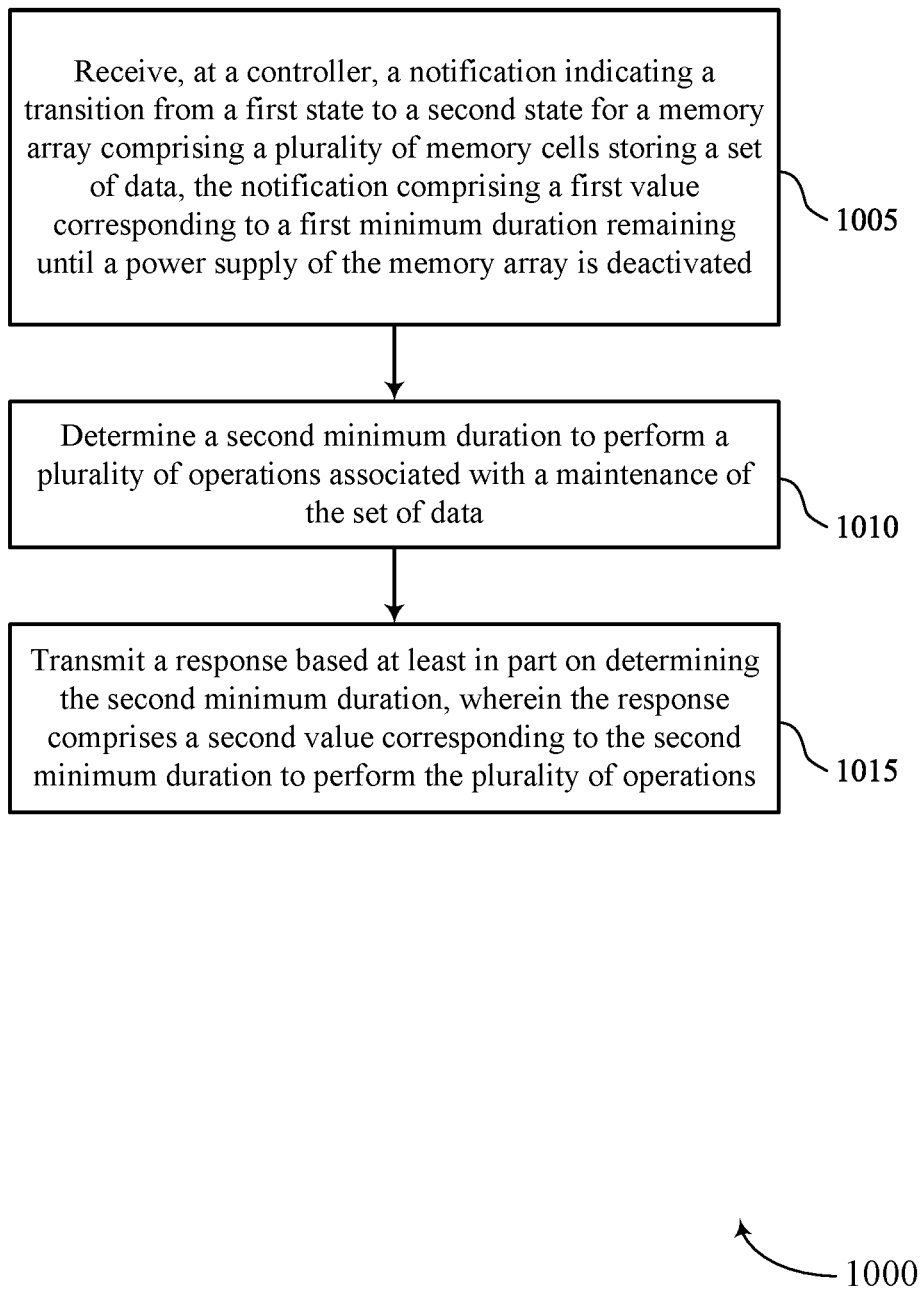

FIG. 10 shows a flowchart illustrating a method 1000 that supports advanced power off notification for managed memory in accordance with examples as disclosed herein. The operations of method 1000 may be implemented by a memory system controller or its components as described herein. For example, the operations of method 1000 may be performed by a memory system controller as described with reference to FIGS. 1 through 4 and 7. In some examples, a memory system controller may execute a set of instructions to control the functional elements of the device to perform the described functions. Additionally or alternatively, the memory system controller may perform aspects of the described functions using special-purpose hardware.

At 1005, the method may include receiving, at a controller, a notification indicating a transition from a first state to a second state for a memory array including a plurality of memory cells storing a set of data, the notification including a first value corresponding to a first minimum duration remaining until a power supply of the memory array is deactivated. The operations of 1005 may be performed in accordance with examples as disclosed herein. In some examples, aspects of the operations of 1005 may be performed by a notification manager 725 as described with reference to FIG. 7.

At 1010, the method may include determining a second minimum duration to perform a plurality of operations associated with a maintenance of the set of data. The operations of 1010 may be performed in accordance with examples as disclosed herein. In some examples, aspects of the operations of 1010 may be performed by an operations manager 730 as described with reference to FIG. 7.

At 1015, the method may include transmitting a response based at least in part on determining the second minimum duration, where the response includes a second value corresponding to the second minimum duration to perform the plurality of operations. The operations of 1015 may be performed in accordance with examples as disclosed herein. In some examples, aspects of the operations of 1015 may be performed by a transmitting manager 735 as described with reference to FIG. 7.

In some examples, an apparatus as described herein may perform a method or methods, such as the method 1000. The apparatus may include, features, circuitry, logic, means, or instructions (e.g., a non-transitory computer-readable medium storing instructions executable by a processor) for receiving, at a controller, a notification indicating a transition from a first state to a second state for a memory array including a plurality of memory cells storing a set of data, the notification including a first value corresponding to a first minimum duration remaining until a power supply of the memory array is deactivated, determining a second minimum duration to perform a plurality of operations associated with a maintenance of the set of data, and transmitting a response based at least in part on determining the second minimum duration, where the response includes a second value corresponding to the second minimum duration to perform the plurality of operations.

Some examples of the method 1000 and the apparatus described herein may further include operations, features, circuitry, logic, means, or instructions for receiving a second notification, the second notification including the second value corresponding to the second minimum duration remaining until the power supply of the memory array may be deactivated.

Some instances of the method 1000 and the apparatus described herein may further include operations, features, circuitry, logic, means, or instructions for determining an absence of a second notification including the second value corresponding to the second minimum duration and executing a quantity of operations according to an order determined based at least in part on determining the absence of the second notification and determining the second minimum duration exceeds the first minimum duration.

Some cases of the method 1000 and the apparatus described herein may further include operations, features, circuitry, logic, means, or instructions for determining an absence of a second notification including the second value corresponding to the second minimum duration and executing the plurality of operations in the second minimum duration based at least in part on identifying the second minimum duration may be less than the first minimum duration.

Some examples of the method 1000 and the apparatus described herein may further include operations, features, circuitry, logic, means, or instructions for determining a parameter associated with the memory array, where the controller may be configured to determine the second minimum duration based at least in part on the parameter.

In some instances of the method 1000 and the apparatus described herein, the parameter may be associated with a temperature of the memory array, a quantity of erase operations executed at the memory array, a quantity of blocks of a plurality of blocks in the memory array associated with a memory organization operation, or an average duration the power supply of the memory array may be deactivated.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array including a plurality of memory cells and a controller coupled with the memory array and configured to receive a notification indicating a transition from a first state of the memory array to a second state of the memory array, the notification including a value, the value including a plurality of bits and corresponding to a minimum duration remaining until a power supply of the memory array is deactivated and executing a plurality of operations according to an order determined based at least in part on a parameter associated with the memory array and receiving the notification including the value In some instances of the apparatus, the plurality of operations may be associated with maintenance of data stored at the plurality of memory cells.

In some examples of the apparatus, the controller may be further configured to execute the plurality of operations the controller may be further configured to transfer data stored at the cache to the memory array based at least in part on receiving the notification.

In some cases, the controller may be further configured to detect a temperature of the plurality of memory cells, where the parameter may be based at least in part on the temperature of the plurality of memory cells.

In some examples, the controller may be further configured to determine a quantity of erase operations executed at the memory array, where the parameter may be based at least in part on the quantity of erase operations.

In some instances, the controller may be further configured to determine a quantity of blocks of the plurality of blocks associated with a memory organization operation, where the parameter may be based at least in part on the quantity of blocks.

In some examples, the controller may be further configured to determine an average duration the power supply of the memory array may be deactivated, where the parameter may be based at least in part on the average duration.

In some cases, the controller may be further configured to suspend an operation of the plurality of operations based at least in part on expiration of the minimum duration remaining until the power supply of the memory array may be deactivated, initialize the memory array after a second duration based at least in part on the power supply of the memory array being activated, receive a second notification indicating the transition from the first state to the second state of the memory array, the notification including a second value corresponding to a second minimum duration remaining until the power supply of the memory array may be deactivated, and execute a second plurality of operations in the second minimum duration according to a second order determined based at least in part on the parameter and receiving the notification and the value, where the second plurality of operations includes the operation of the plurality of operations and where the second order may be based at least in part on suspending the operation.

In some instances, the controller may be further configured to identify the minimum duration from a plurality of minimum durations based at least in part on receiving the value, where the plurality of minimum durations includes at least the minimum duration, a second minimum duration, and a third minimum duration.

In some cases, the controller may be further configured to determine the minimum duration based at least in part on reading a table stored at a register, the register storing the plurality of minimum durations.

Another apparatus is described. The apparatus may include a plurality of components configured to perform operations and a controller coupled with the plurality of components and a memory system, the controller configured to determine a minimum duration to transition the plurality of components from a first power state to a second power state, transmit, to the memory system, a notification indicating a transition from a first state to a second state of the memory system, the notification including a value corresponding to the minimum duration, where the value indicates the minimum duration remaining until a power supply of the memory system is deactivated, refrain from transmitting a command to the memory system prior to deactivation of the power supply of the memory system based at least in part on transmitting the notification to the memory system, and transition the plurality of components from the first power state to the second power state and deactivating the power supply of the memory system after the minimum duration based at least in part on transmitting the notification In some instances, the controller may be further configured to receive a response from the memory system after transmitting the notification, the response including a second value corresponding to a second minimum duration associated with executing a plurality of operations at the memory system.

In some cases, the controller may be further configured to determine the second value may be greater than the value based at least in part on receiving the response from the memory system, transmit a second notification to the memory system, the second notification including the second value indicating the second minimum duration remaining until the power supply of the memory system may be deactivated, and deactivate the power supply of the memory system after the second minimum duration based at least in part on transmitting the second notification.

In some examples, the controller may be further configured to determine the second value may be greater than the value based at least in part on receiving the response from the memory system and refrain from transmitting a second notification to the memory system and deactivate the power supply after the minimum duration based at least in part on determining the second value.

In some instances, the controller may be further configured to determine the second value may be less than the value based at least in part on receiving the response from the memory system and deactivate the power supply of the memory system after the minimum duration based at least in part on determining the second value.

Another apparatus is described. The apparatus may include a memory array including a plurality of memory cells storing a set of data and a controller coupled with the memory array and configured to receive a notification indicating a transition from a first state to a second state for the memory array, the notification including a first value corresponding to a first minimum duration remaining until a power supply of the memory array is deactivated, determine a second minimum duration to perform a plurality of operations associated with a maintenance of the set of data, and transmit a response based at least in part on determining the second minimum duration, where the response includes a second value corresponding to the second minimum duration to perform the plurality of operations In some cases, the controller may be further configured to receive a second notification, the second notification including the second value corresponding to the second minimum duration remaining until the power supply of the memory array may be deactivated.

In some instances, the controller may be further configured to determine an absence of a second notification including the second value corresponding to the second minimum duration and execute a quantity of operations according to an order determined based at least in part on determining the absence of the second notification and determining the second minimum duration exceeds the first minimum duration.

In some examples, the controller may be further configured to determine an absence of a second notification including the second value corresponding to the second minimum duration and execute the plurality of operations in the second minimum duration based at least in part on identifying the second minimum duration may be less than the first minimum duration.

In some cases, the controller may be further configured to determine a parameter associated with the memory array, where the controller may be configured to determine the second minimum duration based at least in part on the parameter.

In some instances of the apparatus, the parameter may be associated with a temperature of the memory array, a quantity of erase operations executed at the memory array, a quantity of blocks of a plurality of blocks in the memory array associated with a memory organization operation, or an average duration the power supply of the memory array may be deactivated.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if" "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory array comprising a plurality of memory cells;
a controller coupled with the memory array and configured to:
receive a notification indicating a transition from a first state of the memory array to a second state of the memory array, the notification comprising a value, the value comprising a plurality of bits and corresponding to a minimum duration remaining until a power supply of the memory array is deactivated;
identify the minimum duration from a plurality of minimum durations based at least in part on receiving the value, wherein the plurality of minimum durations comprises at least the minimum duration, a second minimum duration, and a third minimum duration; and
execute a plurality of operations according to an order determined based at least in part on a parameter associated with the memory array and receiving the notification comprising the value.

2. The apparatus of claim 1, wherein the plurality of operations are associated with maintenance of data stored at the plurality of memory cells.

3. The apparatus of claim 1, wherein the apparatus further comprises a cache, and wherein to execute the plurality of operations the controller is further configured to:
transfer data stored at the cache to the memory array based at least in part on receiving the notification.

4. The apparatus of claim 1, wherein the controller is further configured to:
detect a temperature of the plurality of memory cells, wherein the parameter is based at least in part on the temperature of the plurality of memory cells.

5. The apparatus of claim 1, wherein the controller is further configured to:
determine a quantity of erase operations executed at the memory array, wherein the parameter is based at least in part on the quantity of erase operations.

6. The apparatus of claim 1, wherein the memory array further comprises a plurality of blocks, and the controller is further configured to:
determine a quantity of blocks of the plurality of blocks associated with a memory organization operation, wherein the parameter is based at least in part on the quantity of blocks.

7. An apparatus comprising:
a memory array comprising a plurality of memory cells;
a controller coupled with the memory array and configured to:
receive a notification indicating a transition from a first state of the memory array to a second state of the memory array, the notification comprising a value, the value comprising a plurality of bits and corresponding to a minimum duration remaining until a power supply of the memory array is deactivated;
determine an average duration the power supply of the memory array is deactivated; and
execute a plurality of operations according to an order determined based at least in part on a parameter associated with the memory array and receiving the notification comprising the value, wherein the parameter is based at least in part on the average duration.

8. An apparatus comprising:
a memory array comprising a plurality of memory cells;
a controller coupled with the memory array and configured to:
receive a notification indicating a transition from a first state of the memory array to a second state of the memory array, the notification comprising a value, the value comprising a plurality of bits and corresponding to a minimum duration remaining until a power supply of the memory array is deactivated;
execute a plurality of operations according to an order determined based at least in part on a parameter associated with the memory array and receiving the notification comprising the value;
suspend an operation of the plurality of operations based at least in part on expiration of the minimum duration remaining until the power supply of the memory array is deactivated;
initialize the memory array after a second duration based at least in part on the power supply of the memory array being activated;
receive a second notification indicating the transition from the first state to the second state of the memory array, the notification comprising a second value corresponding to a second minimum duration remaining until the power supply of the memory array is deactivated; and
execute a second plurality of operations in the second minimum duration according to a second order determined based at least in part on the parameter and receiving the notification and the value, wherein the second plurality of operations includes the operation of the plurality of operations and wherein the second order is based at least in part on suspending the operation.

9. The apparatus of claim 1, wherein the controller is further configured to:
determine the minimum duration based at least in part on reading a table stored at a register, the register storing the plurality of minimum durations.

10. A non-transitory computer-readable medium storing code comprising instructions, which when executed by a processor of an electronic device, cause the electronic device to:
receive a notification indicating a transition from a first state to a second state of a memory array, the notification comprising a value, the value comprising a plurality of bits and corresponding to a minimum duration remaining until a power supply of the memory array is deactivated;
identify the minimum duration from a plurality of minimum durations based at least in part on receiving the value, wherein the plurality of minimum durations comprises at least the minimum duration, a second minimum duration, and a third minimum duration; and
execute a plurality of operations according to an order determined based at least in part on a parameter associated with the memory array and receiving the notification comprising the value.

11. The non-transitory computer-readable medium of claim 10, wherein the plurality of operations are associated with a maintenance of data stored at a plurality of memory cells in the memory array.

12. The non-transitory computer-readable medium of claim 10, wherein the instructions, when executed by the processor of the electronic device, further cause the electronic device to transfer data stored at a cache to the memory array based at least in part on receiving the notification and executing the plurality of operations.

13. The non-transitory computer-readable medium of claim 10, wherein the instructions, when executed by the processor of the electronic device, further cause the electronic device to determine the parameter, wherein the parameter is associated with the memory array and wherein the parameter is associated with a temperature, a quantity of erase operations executed at the memory array, a quantity of blocks of a plurality of blocks in the memory array associated with a memory organization operation, or an average duration the power supply of the memory array is deactivated.

14. The non-transitory computer-readable medium of claim 10, wherein the instructions, when executed by the processor of the electronic device, further cause the electronic device to:

suspend an operation of the plurality of operations based at least in part on expiration of the minimum duration remaining until the power supply of the memory array is deactivated;

initialize the memory array after a second duration based at least in part on the power supply of the memory array being activated;

receive a second notification indicating the transition from the first state to the second state of the memory array, the notification comprising a second value corresponding to a second minimum duration remaining until the power supply of the memory array is deactivated; and execute a second plurality of operations in the second minimum duration according to a second order determined based at least in part on the parameter and receiving the notification and the value, wherein the second plurality of operations includes the operation of the plurality of operations and wherein the second order is based at least in part on suspending the operation.

15. The non-transitory computer-readable medium of claim 10, wherein the instructions, when executed by the processor of the electronic device, further cause the electronic device to determine the minimum duration based at least in part on reading a table stored at a register, the register storing the plurality of minimum durations.

* * * * *